(12) United States Patent
Takasu et al.

(10) Patent No.: US 6,914,478 B2
(45) Date of Patent: Jul. 5, 2005

(54) DEMODULATION METHOD AND DEMODULATOR

(75) Inventors: Hisashi Takasu, Chiryu (JP); Michiru Takahashi, Niwa-gun (JP)

(73) Assignee: Denso Corporation, Kariya (JP)

( * ) Notice: Subject to any disclaimer, the term of this patent is extended or adjusted under 35 U.S.C. 154(b) by 60 days.

(21) Appl. No.: 10/630,810

(22) Filed: Jul. 31, 2003

(65) Prior Publication Data

US 2004/0021510 A1 Feb. 5, 2004

(30) Foreign Application Priority Data

Aug. 1, 2002 (JP) .......................................... 2002-225063
May 21, 2003 (JP) .......................................... 2003-143777

(51) Int. Cl.[7] .............................. H03D 3/00; H04L 27/14
(52) U.S. Cl. ........................ 329/300; 375/324; 375/334
(58) Field of Search ................................ 329/300–303, 329/315; 360/30; 375/324, 334–337

(56) References Cited

U.S. PATENT DOCUMENTS 5,483,193 A    1/1996   Kennedy et al.
6,160,857 A   12/2000   Yang

FOREIGN PATENT DOCUMENTS

| JP | A-S54-087465 | 7/1979 |
| JP | A-H05-48663 | 2/1993 |
| JP | A-H08-237320 | 9/1996 |
| JP | 8-331186 | * 12/1996 |
| JP | A-10-173715 | 6/1998 |
| JP | 10-257109 | * 9/1998 |

* cited by examiner

Primary Examiner—David Mis
(74) Attorney, Agent, or Firm—Posz Law Group, PLC

(57) ABSTRACT

A demodulator includes a count section, a synchronization timing setting section, and a code judgment section. The count section has four counters that count a number of waves of an FSK-modulated digital signal at different timing within a bit time width. The synchronization timing setting section designates a synchronized timing signal based on the count value of the count section. Then, the code judgment section compares the count value with a threshold value to judge the signal level, thereby decoding the digital signal.

25 Claims, 15 Drawing Sheets

DEMODULATION METHOD AND DEMODULATOR

CROSS REFERENCE TO RELATED APPLICATIONS

This application is based on Japanese Patent Applications No. 2002-225063 filed on Aug. 1, 2002 and No. 2003-143777 filed on May 21, 2003, the contents of which are incorporated herein by reference.

BACKGROUND OF THE INVENTION

1. Field of the Invention

The present invention relates to a demodulation method and a demodulator that demodulates signals, which have been modulated based on the Frequency Shift Keying (FSK) modulation scheme.

2. Description of Related Art

A FSK modulation is known as a conventional modulation scheme used for sending digital signals from wireless transmitters. A FSK modulator, which performs the FSK modulation, modulates a frequency signal of a carrier wave so that different carrier frequencies represent signal levels of the digital signals.

FIG. 15 is a block diagram showing a typical arrangement of a FSK receiver 102 that has a demodulator for demodulating FSK-modulated signals. The FSK receiver 102 includes an antenna 104, a radio frequency band-pass filter (RF-BPF) 106, an RF amplifier 108, a local oscillator 110, a mixer 112, an intermediate frequency band-pass filter (IF-BPF) 114, an IF amplifier 116, and a demodulator 120.

The antenna 104 receives a radio wave sent from a transmitter (not shown). The RF-BPF 106 extracts a signal component within a certain frequency band from the received signal provided by the antenna 104. The RF amplifier 108 amplifies an output of the RF-BPF 106. The mixer 112 mixes an output of the RF amplifier 108 with a local signal generated by the local oscillator 110 to convert the output of the RF amplifier 108 into an intermediate frequency (IF) signal. The IF-BPF 114 eliminates redundant signal components from an output of the mixer 112. The IF amplifier 116 amplifies an output of the IF-BPF 114, and provides it to the demodulator 120.

FIG. 16A is a block diagram showing an arrangement of the demodulator 120 that performs a quadrature demodulation, which is one of the common demodulation schemes. The quadrature demodulator includes a phase shifter 122, a multiplier 124, a low-pass filter (LPF) 126, and a comparator 128. The phase shifter 122 shifts a phase of an IF signal to produce a phase-shifted signal. The multiplier 124 mixes the IF signal to be demodulated with the phase-shifted signal. The LPF 126 smoothes the mixed signal, and the comparator 128 discriminates a level of the smoothed signal to digitalize the smoothed signal, so that the quadrature demodulator produces a demodulated digital signal.

If a center frequency of an FSK-modulated signal is "F0" and a signal frequency of an input signal is "F", the phase shifter 122 makes a phase rotation by 90 degrees ($\pi/2$ rad) to the input signal when F is equal to F0. It also makes the phase rotation by a certain degree that is smaller than 90 degrees when F is lower than F0, and makes the phase rotation by a certain degree that is greater than 90 degrees when F is higher than F0.

The multiplier 124 produces an output that is expressed by the following equation (21) when F is equal to F0 (phase rotation: $\pi/2$), expressed by equation (22) when F is lower than F0 (phase rotation: $\pi/2-\alpha$), or expressed by equation (23) if F is higher than F0 (phase rotation: $\pi/2+\alpha$), where $0<\alpha<\pi/2$.

$$\sin(\theta)\times\sin(\theta+\pi/2)=\{\sin(2\theta)\}/2 \quad (21)$$

$$\sin(\theta)\times\sin(\theta+\pi/2-\alpha)=\{\sin(2\theta-\alpha)+\sin(\alpha)\}/2 \quad (22)$$

$$\sin(\theta)\times\sin(\theta+\pi/2+\alpha)=\{\sin(2\theta+\alpha)-\sin(\alpha)\}/2 \quad (23)$$

By smoothing the output of the multiplier 124, a direct current (DC) component $\pm\sin(\alpha)$ appearing in the second term of the right side of the equations (22) and (23) is extracted. The DC component is positive or negative when F is lower than F0 or F is higher than F0, respectively. The comparator 128 judges the extracted signal level, thereby decoding the transmitted digital signal.

Besides the quadrature demodulator, a digital-type FSK demodulator uses a one-shot multivibrator as shown in FIG. 16B. The FSK demodulator includes a one-shot multivibrator 134, an LPF 136, and a comparator 138. As shown in FIG. 16C, the one-shot multivibrator 134 produces, from an input V1, a pulse signal V2 that has a 50% duty cycle when F is equal to F0, a duty cycle smaller than 50% when F is lower than F0, or a duty cycle greater than 50% when F is higher than F0. The LPF 136 smoothes the output V2 of the one-shot multivibrator 134. The comparator 138 compares the smoothed signal V3 from the one-shot multivibrator 134 with a threshold signal level V4 that corresponds to a 50% duty cycle, thereby decoding the transmitted digital signal.

The quadrature demodulator uses the phase shifter 122, the multiplier 124, and the LPF 126, while the FSK demodulator that has the one-shot multivibrator uses the LPF 136. Both of the demodulators include analog circuits having coils and capacitors, which are difficult to be integrated in an LSI. This prevents the demodulators from reducing in size and costs.

Another demodulator is described in JP-A-H10-173715. The demodulator has a counter that operates at a system clock frequency higher than a frequency of an input signal, and evaluates a count value at a certain timing to discriminate a phase and a frequency of the input signal. Since the demodulator includes a counter, a register, and a logic circuit, instead of using the analog circuits, the demodulator can be integrated in the LSI. Therefore, size reduction and cost reduction can be accomplished.

However, the demodulator requires the system clock that has a higher frequency than the input signal. On this account, it cannot be inputted with the input signal directly, and requires a circuit arrangement, such as a local oscillator, a mixer, an IF-BPF, and an IF amplifier, for converting the input signal into an IF signal as shown in FIG. 15. Although the demodulator itself can be made compact because it does not require the analog circuit, the receiver that includes the demodulator requires analog circuits, which has coils, capacitors, surface acoustic wave (SAW) elements, for an IF conversion as preceding stages. Therefore, this prevents the receiver from reducing in size and costs.

SUMMARY OF THE INVENTION

An object of the present invention is to provide a demodulation method and a demodulator that reduces a receiver in size. According to one aspect of the present invention, a demodulation method includes a counting step and a judging step. The counting step counts the number of waves of a demodulated signal in every certain time period. Then, the judging step judges a digital signal based on the number of waves in the time period. As a result, a demodulator that includes the demodulation method can demodulate the digital signal without an analog circuit, and reduces in size and costs.

Furthermore, the demodulation method does not use a high frequency signal having higher frequency than the modulated signal. Accordingly, the demodulation method can demodulate the modulated signal without conversion of the modulated signal from a RF signal into an IF signal. As a result, the demodulation method can eliminate a circuit arrangement for the conversion of RF signal into IF signal, and the receiver reduces in size and costs.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF PREFERRED EMBODIMENTS

Figure 1A:
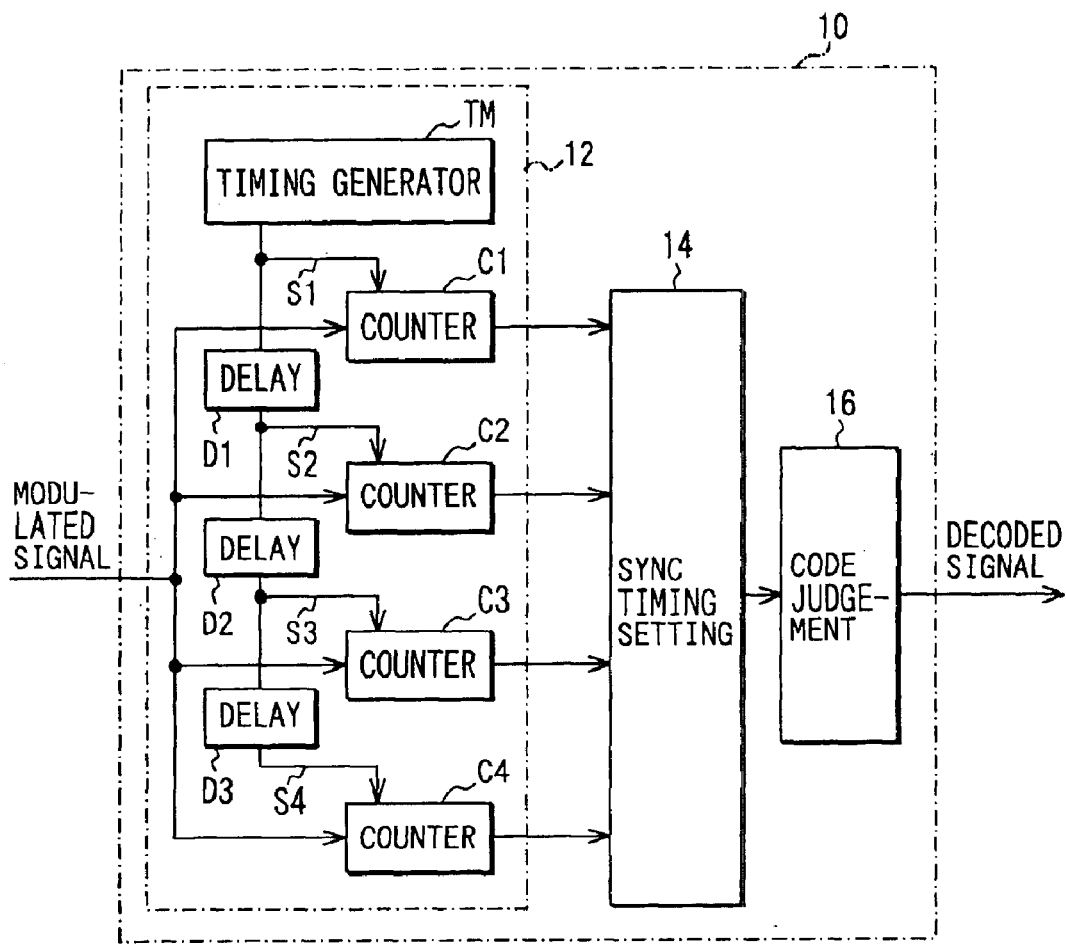
FIG. 1A is a block diagram showing an arrangement of a demodulator according to a first embodiment of the present invention.

The preferred embodiments of the present invention will be explained with reference to the accompanying drawings. In the drawing, the same numerals are used for the same components and devices.

[First Embodiment]

A demodulator of the present invention is used as a FSK receiver that is incorporated in keyless entry system units equipped on motor vehicles. Referring to FIG. 1B, the FSK receiver 2 includes an antenna 4, an RF band-pass filter (RF-BPF) 6, an RF amplifier 8, and a demodulator 10. The antenna 4 receives a radio wave sent from a transmitter (not shown). The RF-BPF 6 extracts a signal component with a certain frequency band from the received signal provided by the antenna 4. The RF amplifier 8 amplifies an output of the RF-BPF 6. The demodulator 10 demodulates an output of the RF amplifier 8 into a digital signal.

The antenna 4 and the RF amplifier 8 generally have limited frequency bands in terms of radio wave reception and signal amplification. If redundant signal components can be cut off sufficiently by the limited frequency bands, the RF-BPF 6 can be eliminated. The received signal (modulated signal) is an FSK-modulated signal, and a signal level "0" of the digital signal and a signal level "1" of the digital signal are assigned to frequencies F0+F1 and F0−F1, respectively.

Figure 1B:
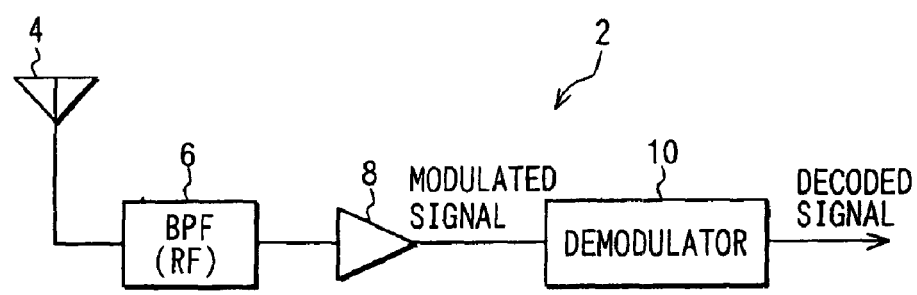
FIG. 1B is a block diagram showing an FSK receiver that includes the demodulator.

Referring to FIG. 1A, the demodulator 10 includes a count section 12, a synchronization timing (sync timing) setting section 14, and a code judgment section 16. The count section 12 counts the number of waves of an input signal, which is an FSK-modulated signal, entered to the demodulator 10. The count section 12 includes four counters C1 to C4, delay circuits D1 to D3, and a timing generation circuit TM.

The counters C1 to C4 are connected in parallel, and operate based on the input signal (modulated signal). The timing generation circuit TM generates a first timing signal S1 that has a period equal to a time length of one bit (bit time width) T of the modulated digital signal with respect to the modulated signal. The delay circuit D1 delays the first timing signal S1 by a quarter of the bit time width T (T/4) to produce a second timing signal S2. The delay circuit D2 delays the second timing signal S2 by T/4 to produce a third timing signal S3. The delay circuit D3 delays the third timing signal S3 by T/4 to produce a fourth timing signal S4.

The counter Ci (i=1 to 4) is reset by the individual timing signal Si at every expiration of the bit time width T. The counters C1 to C4 have a common cycle time equal to the bit time width T, and operate at individual timings, which differ by T/4 from each other, to count the number of waves of the modulated signal during the bit time width T.

The synchronization timing setting section 14 receives the count values from the counters C1 to C4 immediately before they are reset. It also designates a timing signal Si that is synchronized with a bit border of the digital signal based on the received count values. The code judgment section 16 compares the count value, which is provided by the counter Ci operating in response to the timing signal Si designated by the synchronization timing setting section 14, with a certain threshold value. It produces signal level "0" or "1" if the count value is greater or smaller than the threshold value, respectively, thereby producing the digital signal.

The synchronization timing setting section 14 produces a first average value AV0 of count values larger than the threshold value, and a second average value AV1 of count values smaller than the threshold value for each counter Ci. With the difference of the average values being designated to be the evaluation value DAV (DAV=AV0−AV1), the synchronization timing setting section 14 feeds the count values of the counter Ci with the largest DAV to the code judgment section 16. Namely, the synchronization timing setting section 14 designates the timing signal Si, which is provided to the counter Ci, as a synchronized timing signal with the bit border.

In the demodulator 10, the four counters C1 to C4 of the count section 12 count the numbers of waves of the modulated signal at every expiration, which is different from each other by a quarter of the bit time width T among the counters C1 to C4, of the bit time width T. The synchronization timing setting section 14 designates the timing signal Si that is the synchronized timing signal with the bit border of the digital signal, based on the count values. The code judgment section 16 compares the count values of the counter Ci operating in response to the determined timing signal Si with the threshold value to judge the signal level, thereby decoding the digital signal.

Figure 14:
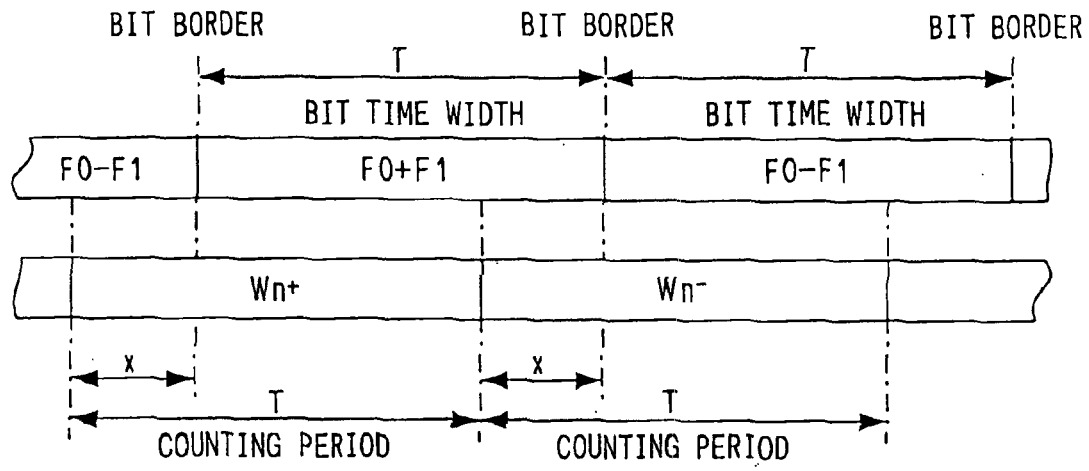
FIG. 14 is a diagram showing a relation between the count value and a timing of counting period.
Figure 15:
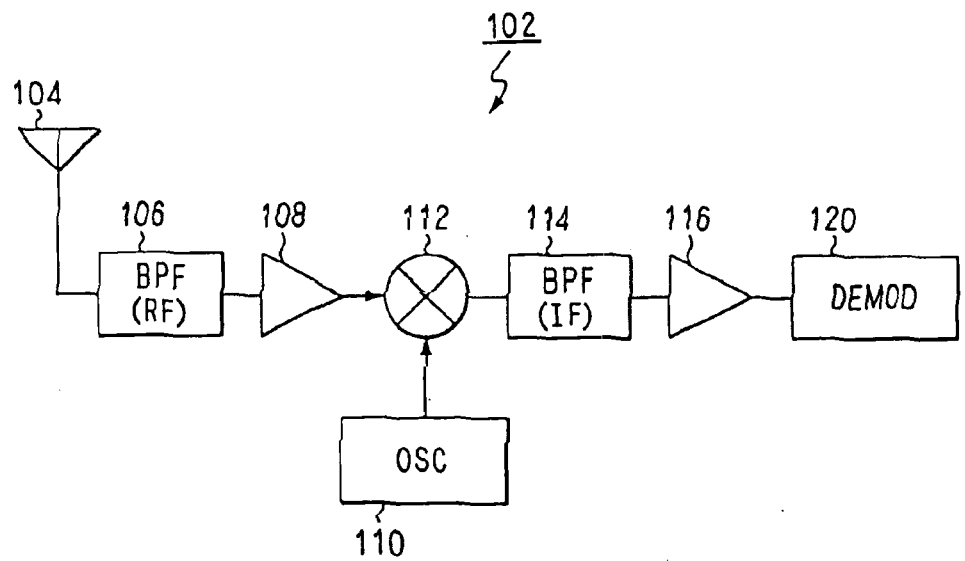
FIG. 15 is a block diagram showing an arrangement of a conventional FSK receiver.
Figure 16A:
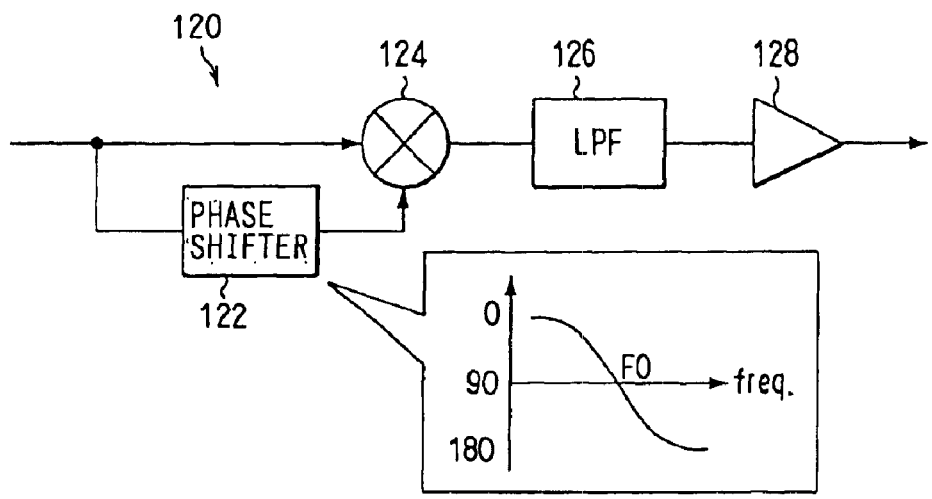
FIG. 16A is a block diagram showing an arrangement of a conventional demodulator.
Figure 16B:
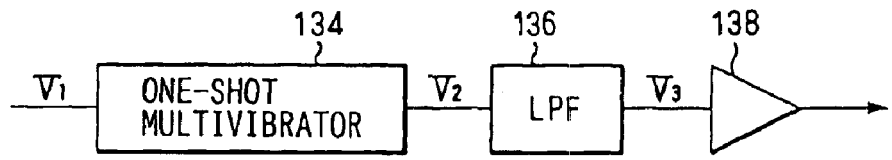
FIG. 16B is a diagram of an operation of the conventional demodulator.
Figure 16C:
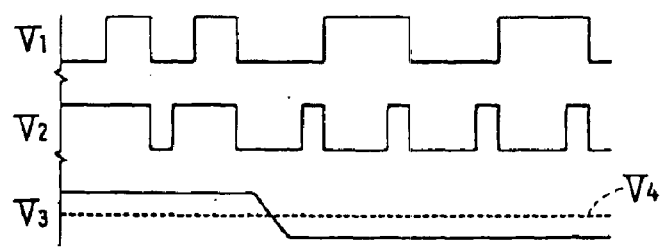
FIG. 16C is a time chart showing signals produced in the conventional demodulator.

In the modulated signal, the frequencies that deviate from a center frequency F0 by ±F1 correspond to the digital signal. Assuming that a counting period corresponds to the bit time width T of the digital signal. Referring to FIG. 14, based on the premise, assuming that a start timing of the counting period is shifted ahead of the bit border by a time length×(x<T/2).

In the counting period in which the modulated signal of the frequency F0+F1 is mainly included, the count value Wn+ is expressed by the following equation (1). In the counting period in which the modulated signal of the frequency F0−F1 is mainly included, the count value Wn− is expressed by the following equation (2). The signal level is assumed to alternate at every bit.

$$Wn+ = (F0+F1)\cdot(T-x) + (F0-F1)\cdot x \quad (1)$$
$$= (F0+F1)\cdot T - 2\cdot F1 \cdot x$$

$$Wn- = (F0-F1)\cdot(T-x) + (F0+F1)\cdot x \quad (2)$$
$$= (F0-F1)\cdot T + 2\cdot F1 \cdot x$$

The number of waves are Wn+=(F0+F1)·T and Wn−=(F0−F1)·T when the start timing corresponds to a bit border (x=0). An error of the number of waves caused by a deviation of a synchronization is 2·F1·x in each cases.

When the deviation of start timing from the bit border satisfies an equation expressed by 2·F1·x<1, the synchronization between the start timing and the bit border can be judged. Accordingly, a resolution of synchronization is expressed by an equation, x<1/(2·F1).

As shown by the following equation (3), if the count value Wn+ is larger than the number of waves F0·T for the center frequency F0 or the count value Wn− is smaller than the number of waves F0·T for the center frequency F0, the signal level can be judged correctly. An equation (4) results from rearrangement of the equation (3).

$$Wn- < F0\cdot T < Wn+ \quad (3)$$

$$X < T/2 \quad (4)$$

The time difference of the start timings of the counting periods is set to be smaller than a half of a bit-corresponding period. In other words, to prepare three or more start timings within the bit-corresponding period is sufficient. However, for the actual circuit, the number of the start timings of the counting periods is preferably set to be a power of 2 to simplify the arrangement of a start timing generation circuit. The lengths of the counting periods, which are sufficiently shorter than the time length of the bit-corresponding period, are desirably long length as long as possible from the viewpoint of reliability. The lengths are also preferably set to be equal to the time length of the bit-corresponding period.

The operation of the demodulator 10 will be explained specifically in connection with the timing chart of FIG. 2. It is assumed that (F0+F1)·T is equal to "12", (F0−F1)·T is equal to "6", and the threshold value used by the code judgment section 16 is set to be "9", which is equal to the number of waves F0·T for the center frequency F0. It is also assumed for the sake of an easy understanding that the timing signal S1 corresponds accurately to the bit border, and noises are not generated.

When the digital signal (modulated digital signal) alternates at every bit, e.g., 0, 1, 0, 1, . . . , the counters C1 to C4 produce the count values as expressed by the equations (1) and (2) in every counting period that has the bit time width T. In detail, the counter C1 produces count values "12" and "6" alternately, the counter C2 produces count values "11" and "7" alternately, the counter C3 produces count value "9" only, and the counter C4 produces count values "8" and "10" alternately.

When the modulated digital signal does not alternate, but is invariable, e.g., 0, 0, . . . or 1, 1, . . . , at the bit border, the counters C2 to C4 produce different count values. That is, in a counting period that crosses the bit border of continuous "0" signal level, count value "12" is produced, while in a counting period that crosses the bit border of continuous "1" signal level, count value "6" is produced.

The count value produced by the counter C1 in the counting period that is inferred to correspond to signal level "0" is only "12", whereas the count values produced by the counters C2 and C4 can be "11" or "10" instead of "12". The count value produced by the counter C1 in the counting period that is inferred to correspond to signal level "1" is only "6", whereas the count values produced by the counters C2 and C4 can be "7" or "8" instead of "6". The counter C3 produces always a count value "9", and such inference is not possible.

Accordingly, the first average value AV0 of count values of the counter C1 in the counting period that is inferred to correspond to signal level "0" becomes maximum (AV0= 12). The second average value AV1 of count values of the counter C1 in the counting period that is inferred to correspond to digital signal "1" becomes minimum (AV1=6).

The evaluation value DAV (DAV=AV0-AV1), which is the difference between the average values AV0 and AV1, is maximum when the counter C1 operates in a condition that the timing signal S1 correspond to the bit border. The synchronization timing setting section 14 selects the counter C1 (the timing signal S1) in response to the maximum value of the evaluation value DAV, and sends the count value to the code judgment section 16.

The code judgment section 16 compares the count values "12" and "6", of the counter C1, which has been selected by the synchronization timing setting section 14, with the threshold value "9". It judges that the count value "12", which is larger than the threshold value, is signal level "0", and it also judges that the count value "6", which is smaller than the threshold value, is signal level "1". Then, it produces the digital signal based on the judged signal level.

In such a case, a difference between the count value of the counter C1 and the threshold value is "3". Accordingly, the demodulator 10 can correctly demodulate the modulated signal into the original digital signal if the fluctuation of the count value caused by the noise is within a range of "±2".

The demodulator 10 counts the numbers of the waves of the modulated signal with the counters C1 to C4 that have different operation timings. The demodulator 10 designates the timing, which synchronizes with the bit border of the modulated digital signal, based on the count values. It also judges the signal level of the modulated digital signal. Accordingly, the demodulator 10 can be configured without using analog circuit.

The demodulator 10 does not need to use a high frequency signal that is higher than the modulated signal in frequency. As a result, the demodulator 10 can directly demodulate the received signal (RF signal) without converting into the IF signal. Therefore, the demodulator 10 can be integrated in an LSI, and thus can be reduced in size. The FSK receiver 2 that includes the demodulator 10 also can eliminate a circuit for converting the RF signal into the IF signal, and it can be reduced significantly in size and costs.

For an interactive communication device, when the device includes the FSK receiver 2 having the demodulator 10, the device requires a local oscillator only for its transmission section and does not require the local oscillator for the receiver. Consequently, it can accomplish a full duplex communication while including a compact size circuit that correspond to be designed for a half duplex communication.

Figure 13A:
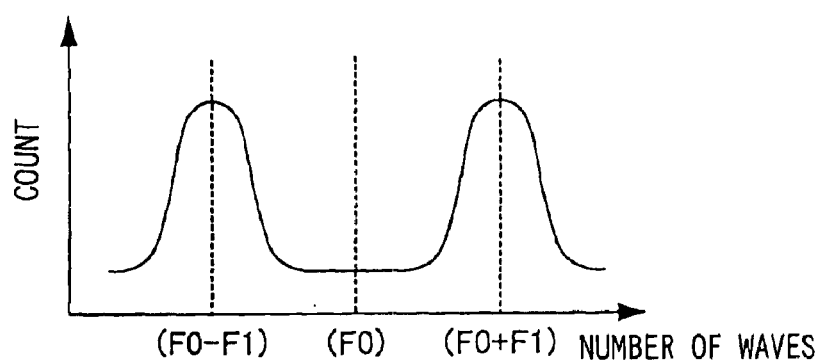
FIGS. 13A through 13D are graphs of distributions of count values.
Figure 13B:
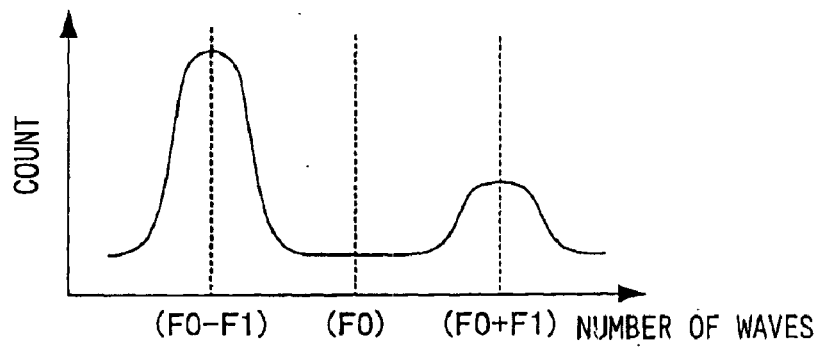
Figure 13C:
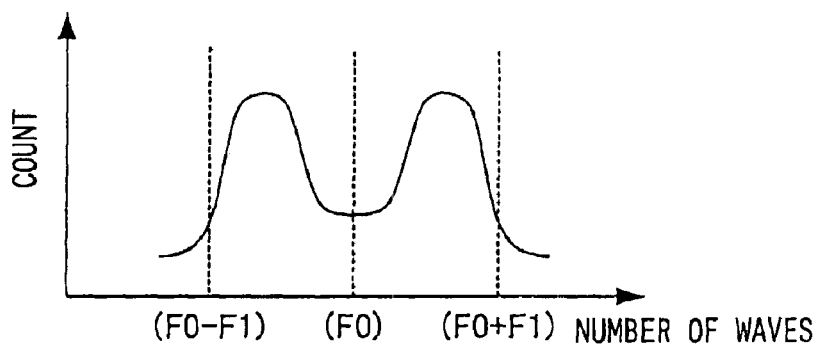
Figure 13D:
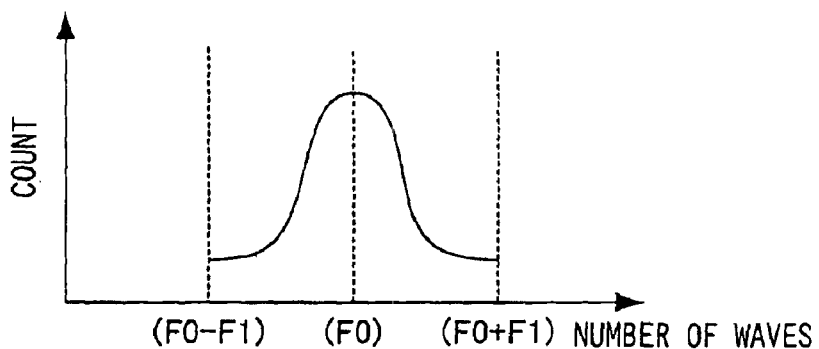

FIGS. 13A to 13D show distributions of count values produced by the counters when the modulated digital signal is binary. Referring to FIG. 13A, in the counting period that the start timing corresponds to the bit border, the number of waves (count value) has peaks of distribution at the frequencies F0±F1 assigned to the signal levels. In case the emergence of signal levels is not even, the peaks have different heights as shown in FIG. 13B. In the counting period that the start timing is at the middle of the bit borders, two peaks of the count values overlap with each other as shown in FIG. 13D. In the counting period that the start timing is between the cases of FIG. 13A and FIG. 13D, the count value has a distribution as shown in FIG. 13C.

As shown in the distribution of FIGS. 13A to 13D, the signal level is presumed based on a condition whether the count value is above or below the value corresponds to the center frequency F0. Then, a suitable counting period that the start timing is nearer to the bit border is selected.

When the difference between the average values is used as the evaluation value, the count result of the center frequency F0 is not reflected to the evaluation value. As a result, in the case of FIG. 13D, the average values are calculated only from the noise, and the difference between the average values can possibly be larger than the case of FIG. 13C.

Figure 3A:
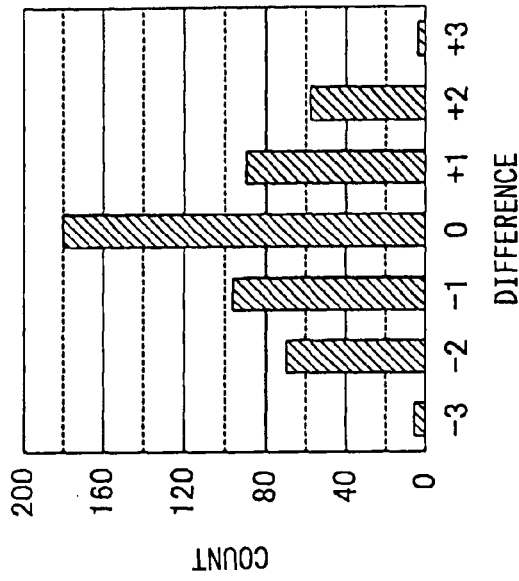
FIGS. 3A and 3B are graphs showing results of simulations.
Figure 3B:
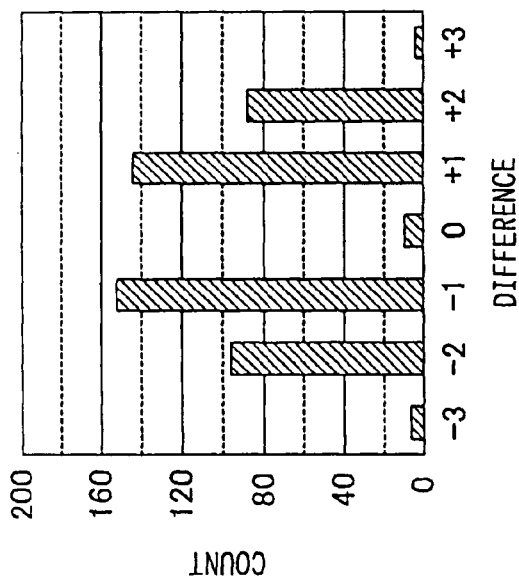
Figure 3C:
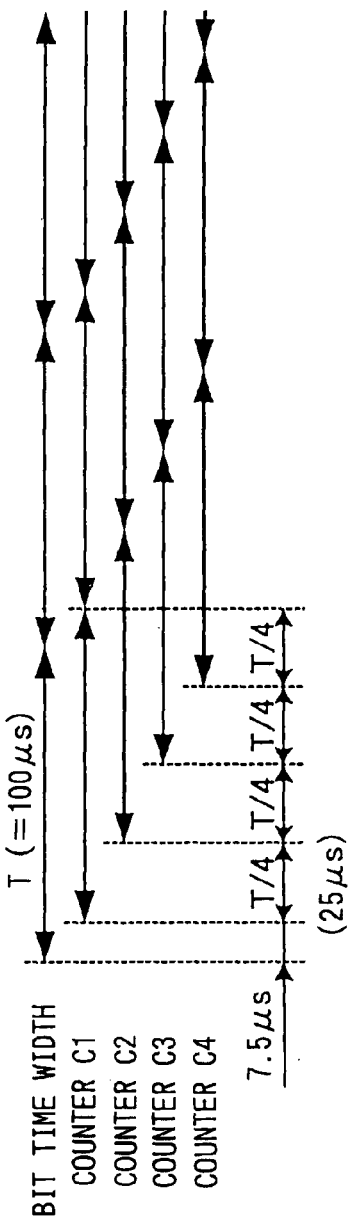
FIG. 3C is a diagram showing a condition of the simulations.

FIGS. 3A and 3B are graphs showing the results of simulations of the distribution of the count values produced by the counters C1 to C4. The simulation is based on an assumption that the frequency deviation ±F1 in relation to the center frequency F0 of the modulated signal is ±15 kHz, the bit rate of the modulated digital signal is 10 kHz (bit time width T=100 $\mu$s), the noise level is s/n=10 dB, and data of 500 bits is received. In addition, referring to FIG. 3C, the counters C1 to C4 count the number of the signal waves at individual timings that shift by T/4 (25 $\mu$s) from each other, and a synchronization deviation between the most synchronized timing and the actual bit border is 7.5 $\mu$s.

FIG. 3A shows the distribution of the count values produced by the counter C1 operating at the most synchronized timing. FIG. 3B shows the distribution of the count values produced by the counter C3 operating at the least synchronized timing. The horizontal axis indicates the difference between the count value and the number of the waves for the center frequency, and the vertical axis indicates the number of times of the count values.

The evaluation value DAV (DAV=AV0−AV1) is calculated based on each distribution. The results in case of FIGS. 3A and 3B are DAV=2.81 and DAV=2.87, respectively. In such a case, the evaluation value DAV in case of the least synchronized timing is greater than the DAV in case of the most synchronized timing. As a result, the synchronization timing setting section 14 may cause an erroneous with the synchronization judgment.

Therefore, it is desirable to use a different evaluation value Dx(=n×DAV) that is multiplied the number N of data, which is used for the calculation of the differential average values DAV, by the differential average values DAV, instead of using the average values. Then, the differential average value Dx is used as the synchronization judgment. The evaluation value Dx is equal to 1383 in case of FIG. 3A and the evaluation value Dx is equal to 917 in case of FIG. 3B. Therefore, the synchronized timing can be designated correctly.

When the number of times of equality of the count value produced by the counter and the number of waves for the center frequency F0 are larger than a certain upper-limit value, the counter (timing signal) may be excluded from the synchronization judgment.

The counters C1 to C4 may have a count capacity sufficient to count all waves in the counting period, i.e., (F0+F1)·T+α, where α is a noise margin, or may have a count capacity sufficient to evaluate the difference between the maximal and minimum values of count value, i.e., 2·F1·T+α.

Namely, in case the difference of frequencies assigned to the signal levels is smaller than the center frequency of the carrier wave used for FSK modulation, the difference of the count values in the counting periods for both signal levels is very small as compared with the total count value. Specifically, assuming that the frequencies F0±F1 used as the modulated signal are set to be based on F0=500MHz and F1=30 kHz and the counting period is set to be 1 ms. The number of waves counted in the counting period (total count value) is 500030 for F0+F1 and 499970 for F0−F1. Accordingly, the difference of count values of both frequencies is 60.

It requires a long counter that has 19 bits to count the number of waves. However, what is crucial is to evaluate the differentials relative to the wave count value (500000) for the center frequency F0. Therefore, the counter is preferably designed to have a length sufficient to evaluate the difference between the maximum value and minimum value counted in the counting period.

[Second Embodiment]

A second embodiment of the invention differs partially from the first embodiment in the operation of the count section 12 and the synchronization timing setting section 14. In FIG. 1A, the timing generation circuit TM generates a timing signal S1 having a half bit time width T/2, and a delay circuit Dj (j=1, 2, 3) produces a timing signal Sj+1 that is derived from the timing signal S1 and delayed by T/8.

Figure 4:
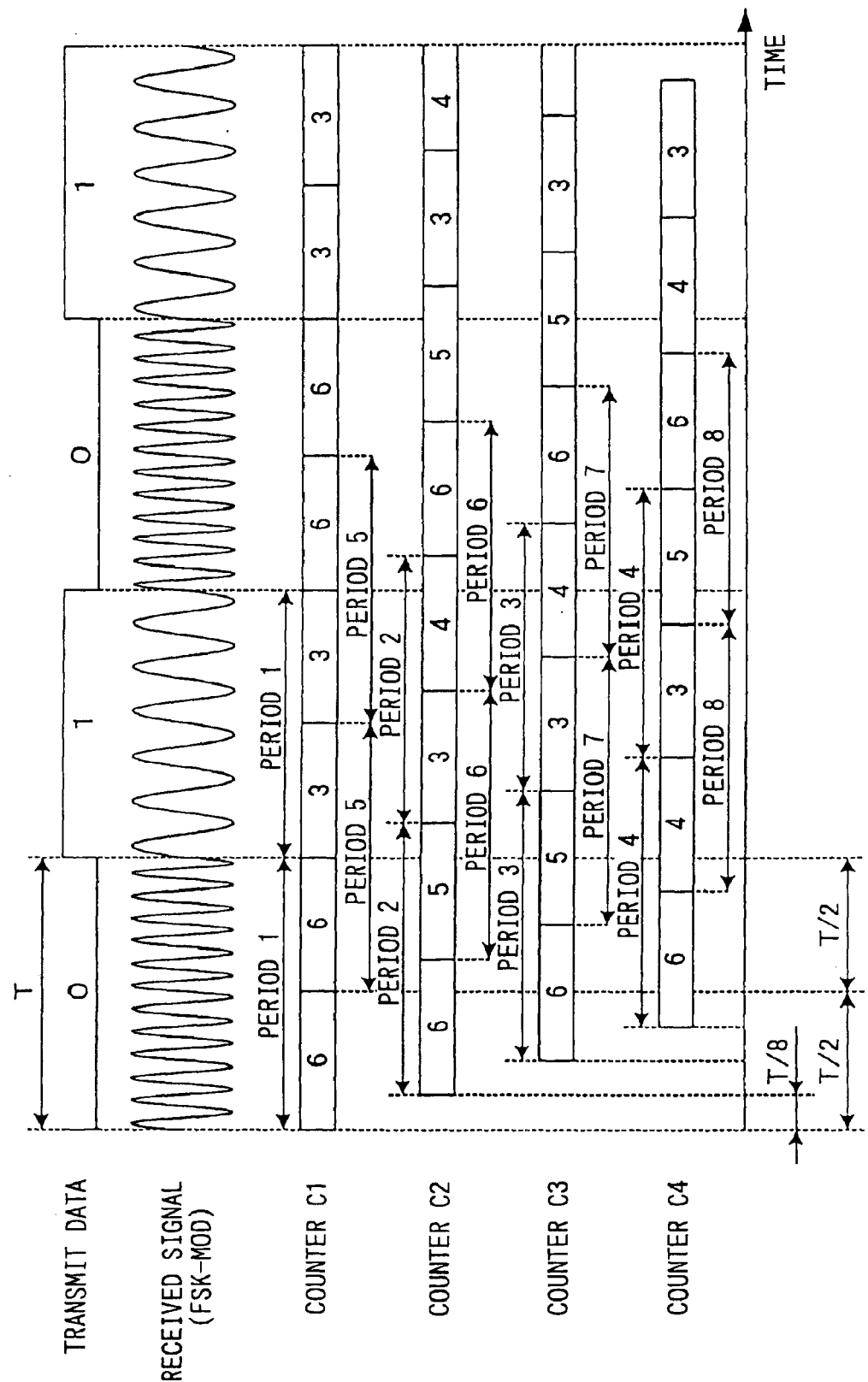
FIG. 4 is a timing chart of a demodulator according to a second embodiment of the present invention.

The counters C1 to C4 operate at the timings that shift sequentially by T/8 as shown in FIG. 4. The counters C1 to C4 operate in a period of T/2 to produce count values of waves of the modulated signal that have been counted during a divided period T/2. The synchronization timing setting section 14 evaluates the sum of count values in two contiguous divided periods of the same counter Ci at eight timings in the bit time width T. Consequently, the four counters produce count values of eight counting periods (length: T) that shift by T/8.

The synchronization timing setting section 14 evaluates the average value AV0 of the sums that are larger than the threshold value at each timing, and the average value AV1 of the sums that are smaller than the threshold value. It designates the difference of the average values to be the evaluation value DAV (DAV=AV0−AV1), and designates a timing that provides the judgment value DAV. It evaluates the sum at each designated timing based on the count value produced by a counter Ci that corresponds to the designated timing. The code judgment section 16 compares the sum with the judgment threshold value to judge the signal level, thereby decoding the digital signal.

The demodulator 10 of the second embodiment is arranged without the analog circuit as in the first embodiment, and thus it can attain the same effect. The number of counting periods can be increased without increasing the number of counters that constitute the count section 12. In consequence, the accuracy of synchronization with the bit border and the reliability of signal level judgment by the code judgment section 16 can be enhanced without increasing the circuit scale.

Although the divided period that is the bit time width divided by 2 is adopted, a divided period that is the bit time width divided by 3 may be adopted alternatively. In case a large number of divided periods are adopted, the demodulator may be arranged to include only one counter and code judgment section 16 so that the signal level judgment result of each divided period is produced directly as the digital signal.

[Third Embodiment]

Figure 5:
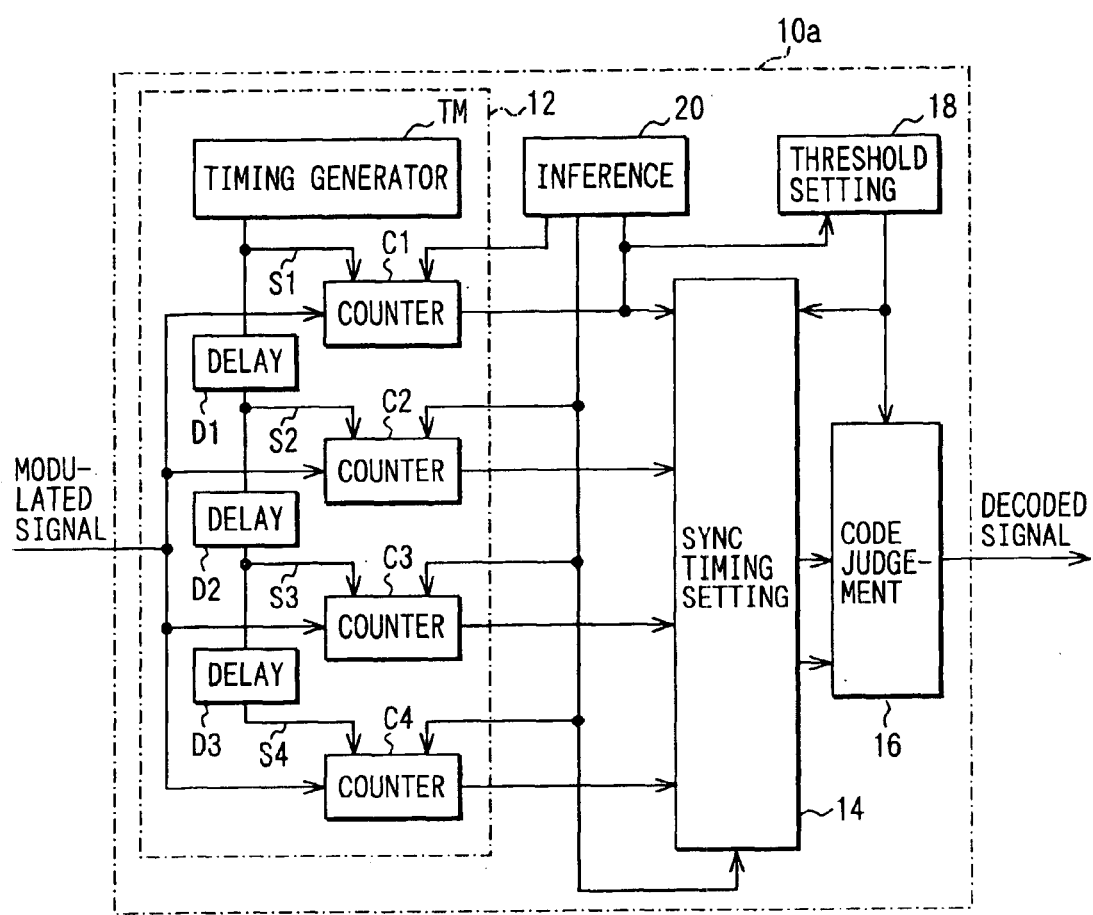
FIG. 5 is a block diagram showing an arrangement of a demodulator according to a third embodiment of the present invention.

As shown in FIG. 5, a demodulator 10a includes a threshold value setting section 18 and a radio wave environment inference section 20 in addition to the arrangement of the first embodiment. The threshold value setting section 18 sets the threshold value used by the synchronization timing setting section 14 and code judgment section 16. The radio wave environment inference section 20 infers the radio wave environment based on the count result produced by the count section 12 and controls the counters C1 to C4 in accordance with the result of inference.

The threshold value setting section 18 monitors the maximum value and the minimum value of count values of the counter C1, and sets the middle value of the maximum and minimum values to be the threshold value and sends it to the synchronization timing setting section 14 and code judgment section 16. In case of FIG. 2, regardless of the timing of operation of the counters C1 to C4, their count values have a maximum value of "12" and minimum value of "16" in the environment without noise. Accordingly, the threshold value set by the threshold value setting section 18 is "9" that is equal to the number of waves F0·T for the center frequency F0.

The radio wave environment inference section 20 monitors the maximum value and the minimum value of count values of the counter C1, and evaluates the variation width (difference between the maximum and minimum values) of the count values. It issues a first halt command to halt the counting of the counters C1 to C4 in case the variation width is larger than a preset halt judgment value. It issues a second halt command to halt the counting of the counter C1 in case the inference of radio wave environment is not needed.

In case the radio wave received by the FSK receiver 2 is weak in electric field strength or an interference signal with a frequency close to the center frequency F0 of the modulated signal exists, the received signal (modulated signal) entered to the demodulator is affected by them. This influence causes count values of counters C1 to C4 to fluctuate, and the radio wave environment can be inferred from the disparity of count values.

Figure 2:
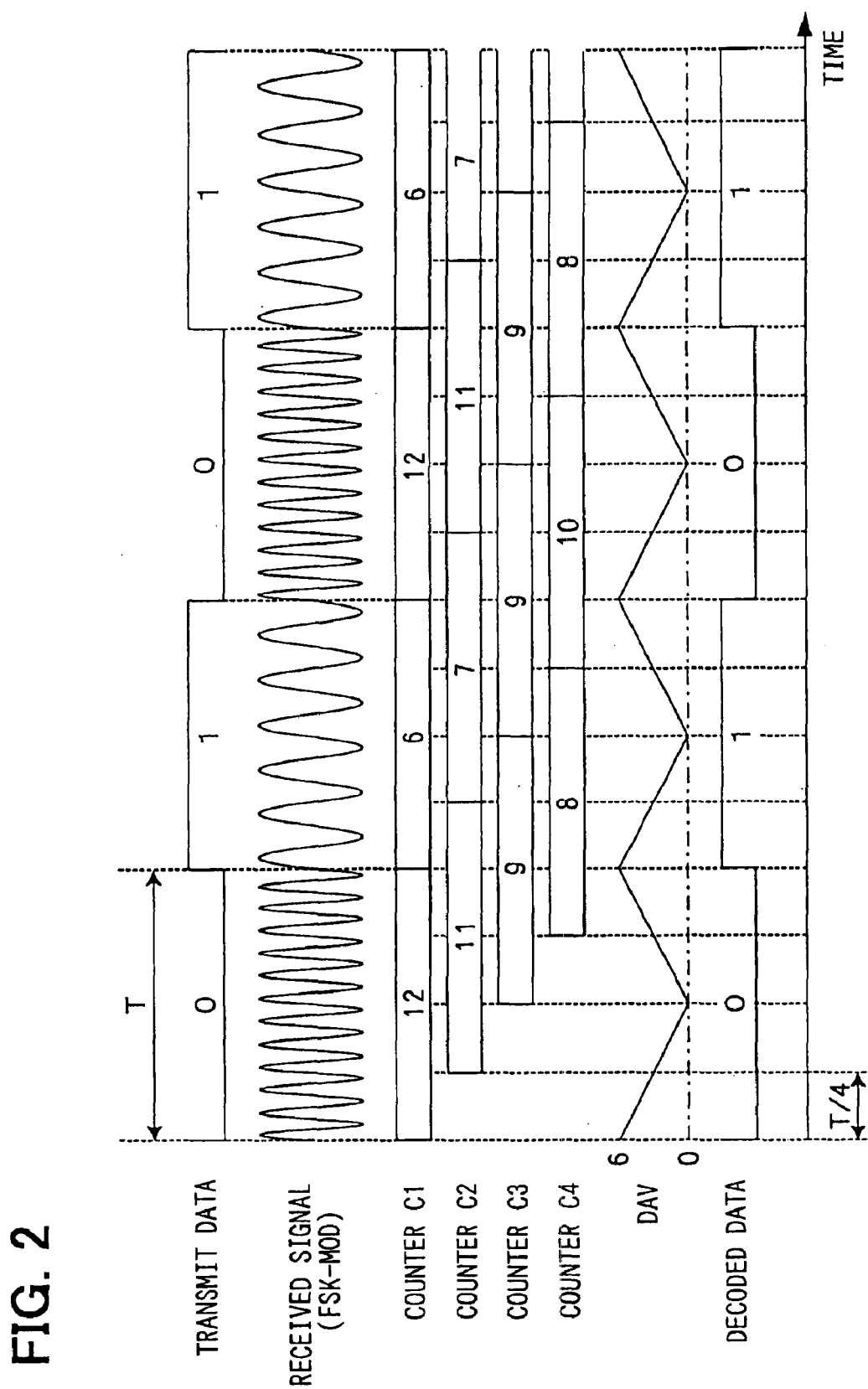
FIG. 2 is a timing chart of the demodulator.

In case of FIG. 2, in the absence of noise, the variation width of count values is 6 (=12−6). Accordingly, the FSK receiver 2 can recognize the presence of influence of noise when the variation width is 7 or above. The halt judgment value is set larger by the amount of allowable noise-caused fluctuation than the variation width in the environment without noise.

According to the demodulator 10a, an optimal threshold value is always set to match with the change of demodulator due to aging or the error of oscillator, whereby the reliability of demodulation process can be enhanced.

The demodulator 10a halts the operation of counters C1 to C4 upon inferring the radio wave environment in which the incoming signal cannot be demodulated correctly, thereby suppressing the useless power consumption. In consequence, the demodulator, when it is powered by a battery, can operate based on a battery which is smaller in capacity or can operate longer in time.

The demodulator uses both the threshold value setting section 18 and the radio wave environment inference section 20, while only one of them may be used instead. The threshold value setting section 18, in case of the absence of the radio wave environment inference section 20, may implement the setting by using the count value produced by any of the counters C1 to C4 instead of the counter C1. It may implement the setting by using a cumulated value or average value of the count values of all counters C1 to C4.

[Fourth Embodiment]

Figure 6:
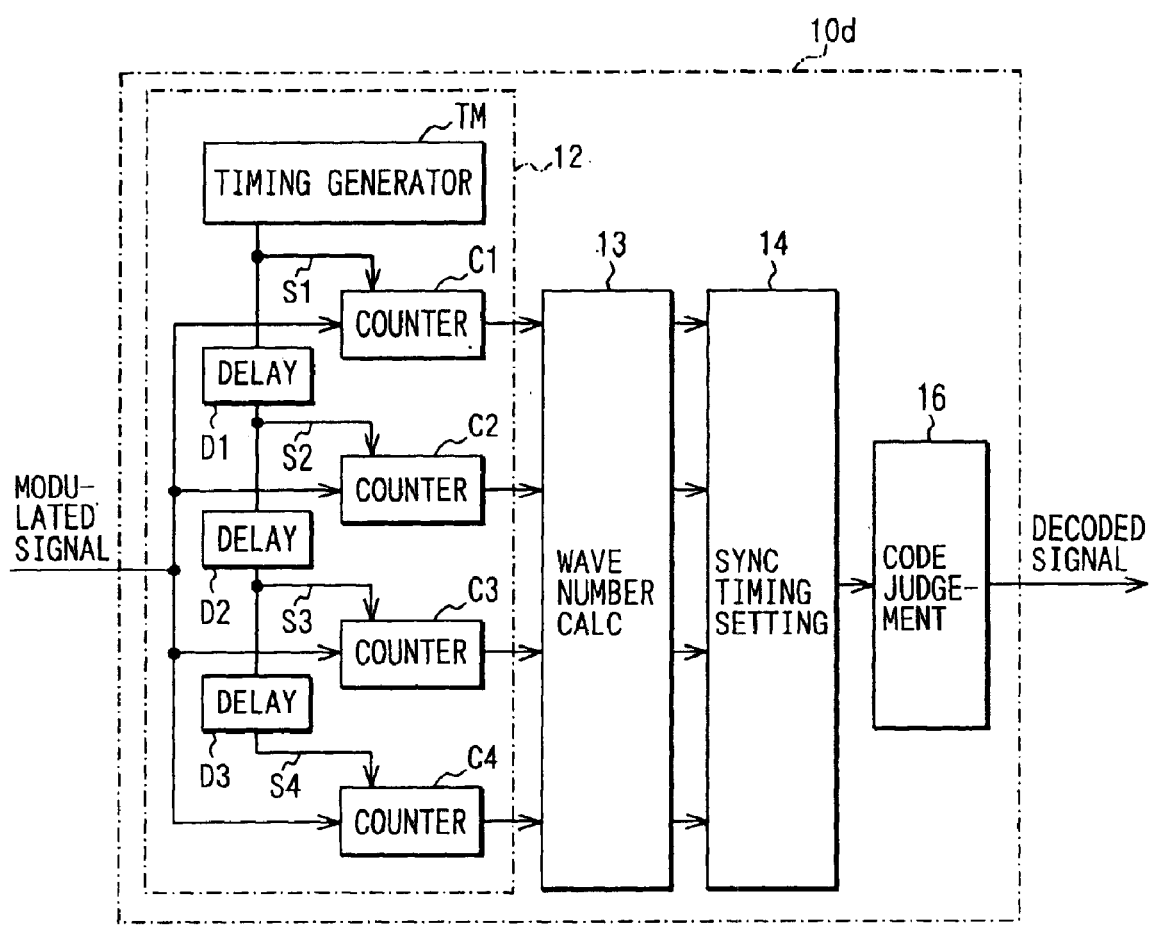
FIG. 6 is a block diagram showing an arrangement of a demodulator according to a fourth embodiment of the present invention.
Figure 7:
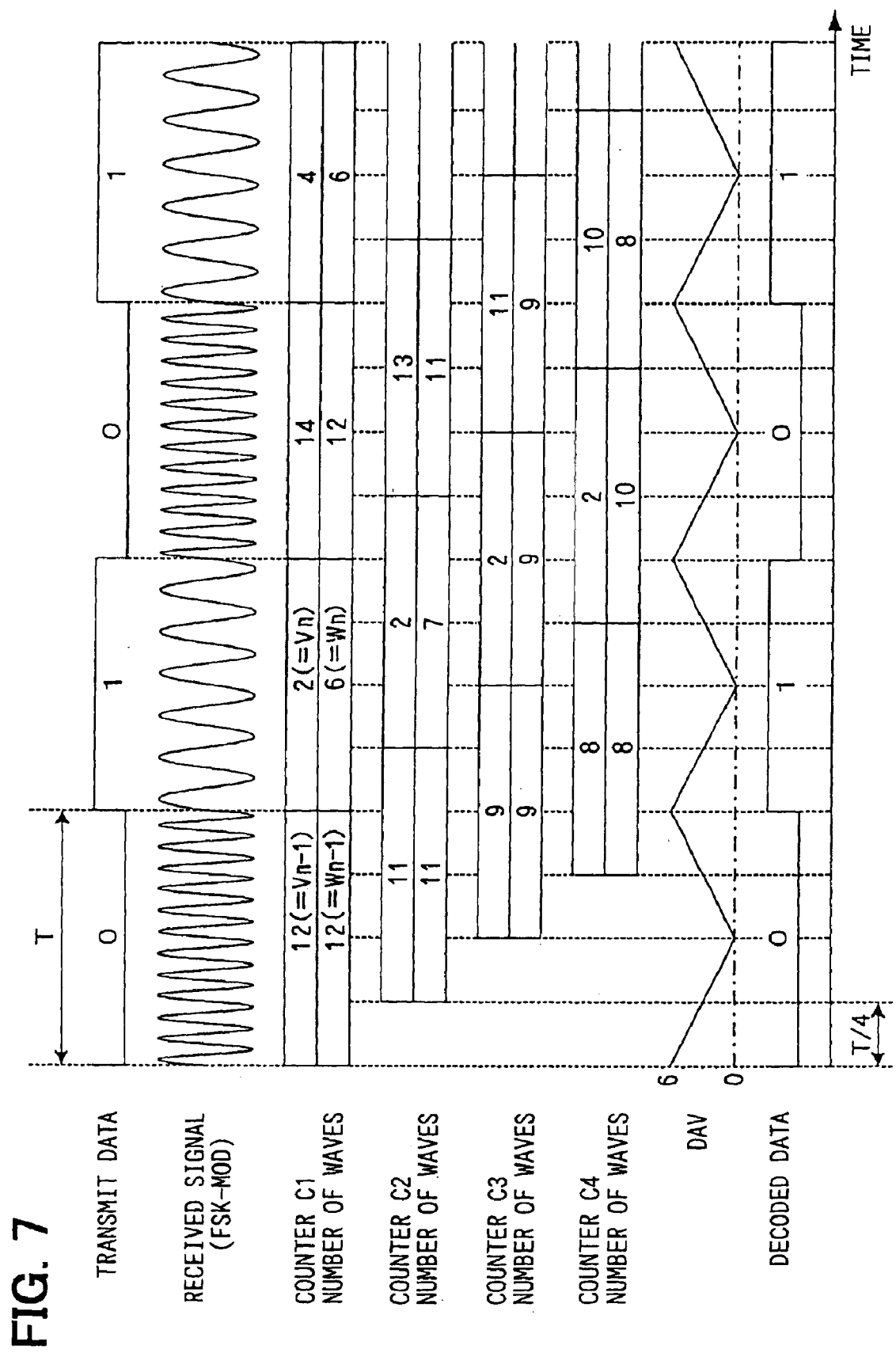
FIG. 7 is a timing chart of the demodulator according to the fourth embodiment of the present invention.

As shown in FIG. 6, a demodulator 10d includes a wave number calculation section 13 in addition to the arrangement of the first embodiment. The wave number calculation section 13 is connected between the count section 12 and the synchronization timing setting section 14. The wave number calculation section 13 calculates the number of waves of the modulated signal, which has been counted during the bit time width T, based on the count values produced by the counters C1 to C4 of the count section 12.

In the demodulator 10d, each counter Ci (i=1 to 4) includes a latch circuit that latches the count value in response to the timing signal Si. The counter Ci is designed to have the free-run operation without being reset by the timing signal Si in the counting operation. The counters C1 to C4 operate at the timings that shift by T/4 from each other and produce count values of waves of the modulated signal in a period of the bit time width T.

The wave number calculation section 13 calculates the number of waves Wn that has been counted in the counting period of each counter Ci by using the following equation (5) when the counter Ci does not overflow (Vn≧Vn−1) or by using the following equation (6) when the counter Ci overflows (vn<Vn−1).

$$Wn = V_n - V_{n-1} \quad (5)$$

$$Wn = V_n - V_{n-1} + 2^k \quad (6)$$

If a present count value is smaller than the previous count value due to the overflow of counter, a value of $2^k$ (k represents the number of bits) is added to the present count value.

The following explains specifically the operation of the demodulator 10d with reference to the timing chart of FIG.

7. The figure is based on the same assumption as the first embodiment that (F0+F1)·T is equal to "12", (F0−F1)·T is equal to "6", and the threshold value used by the code judgment section 16 is set to be "9" that is equal to the number of waves F0·T for the center frequency F0. It is also assumed for the sake of easy understanding that the timing signal S1 is coincident accurately with the bit border, and that noise is generated. The counters C1 to C4 are assumed to have four-bit counters that can count the number "0" to "15".

The counters C1 to C4 produce count values on expiration of counting periods having the bit time width T. Specifically, the counter C1 produces count values of "12", "2", "14" and "14". The counter C2 produces count values of "11", "2" and "13". The counter C3 produces count values of "9", "2" and "11". The counter C4 produces count values of "8", "2" and "10". The wave number calculation section 13 calculates wave numbers "12" and "6" alternately from the count value of the counter C1. Similarly, it calculates wave numbers "11" and "7" alternately from the count value of the counter C2. It calculates wave numbers "8" and "10" alternately from the count value of the counter C4. It produces only wave number "9" from the count value of the counter C3.

The synchronization timing setting section 14 and the code judgment section 16 operates in exactly the same fashion as the case of the first embodiment based on the numbers of waves obtained in the counting periods having different start timings. As explained above, the demodulator 10d operates in exactly the same fashion as the case of the first embodiment, except for the employment of free-run counters for the counters C1 to C4 to obtain the numbers of waves in the counting periods based on the count values produced by the counters, and it attains the same effect as the first embodiment. The use of free-run counters for the counters C1 to C4 and the addition of the wave number calculation section 13 for the demodulator 10 of the first embodiment may be applied to the demodulators of the second and third embodiments.

[Fifth Embodiment]

Figure 8A:
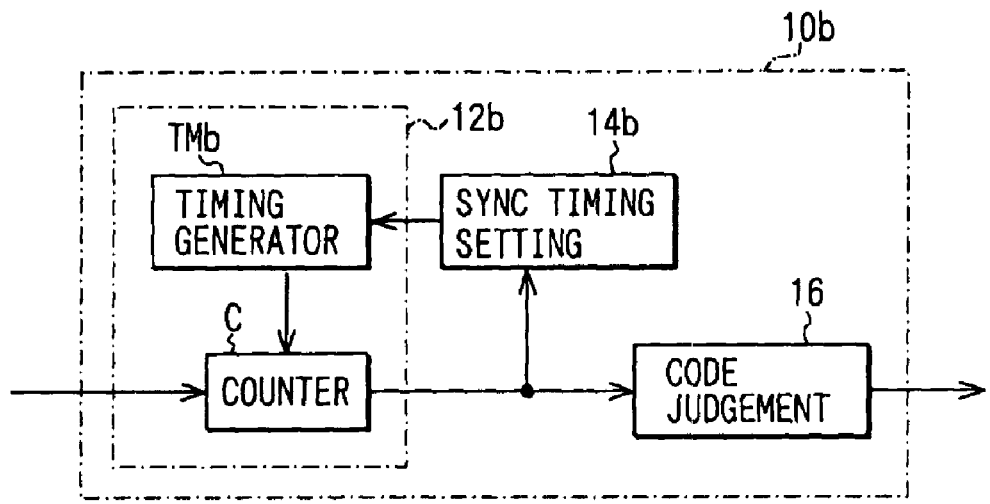
FIG. 8A is a block diagram showing an arrangement of a demodulator according to a fifth embodiment of the present invention.

As shown in FIG. 8A, a demodulator 10b includes a count section 12b, a synchronization timing setting section 14b and a code judgment section 16. The count section 12b has a counter C and a timing generation circuit TMb. The counter C counts the input signal, which is an FSK-modulated signal, entered to the demodulator 10b. The timing generation circuit TMb generates a timing signal for controlling the operational timing of the counter. The synchronization timing setting section 14b designates the timing, which is synchronized with the bit border of the modulated digital signal, based on the count value of the counter C, and sets the timing generation circuit TMb so that the counter C operates at the designated timing. The code judgment section 16 compares the count value of the counter C with the threshold value to judge the signal level, thereby producing the digital signal.

The timing generation circuit TMb sends the timing signal to the timing generation circuit TMb to control the operational timing of the counter C at a resolution of T or T/4. The time periods in which the count operation of the counter C lasts for the bit time width T and a quarter of bit time width T will be called "counting period" and "adjusting period", respectively.

Figure 9:
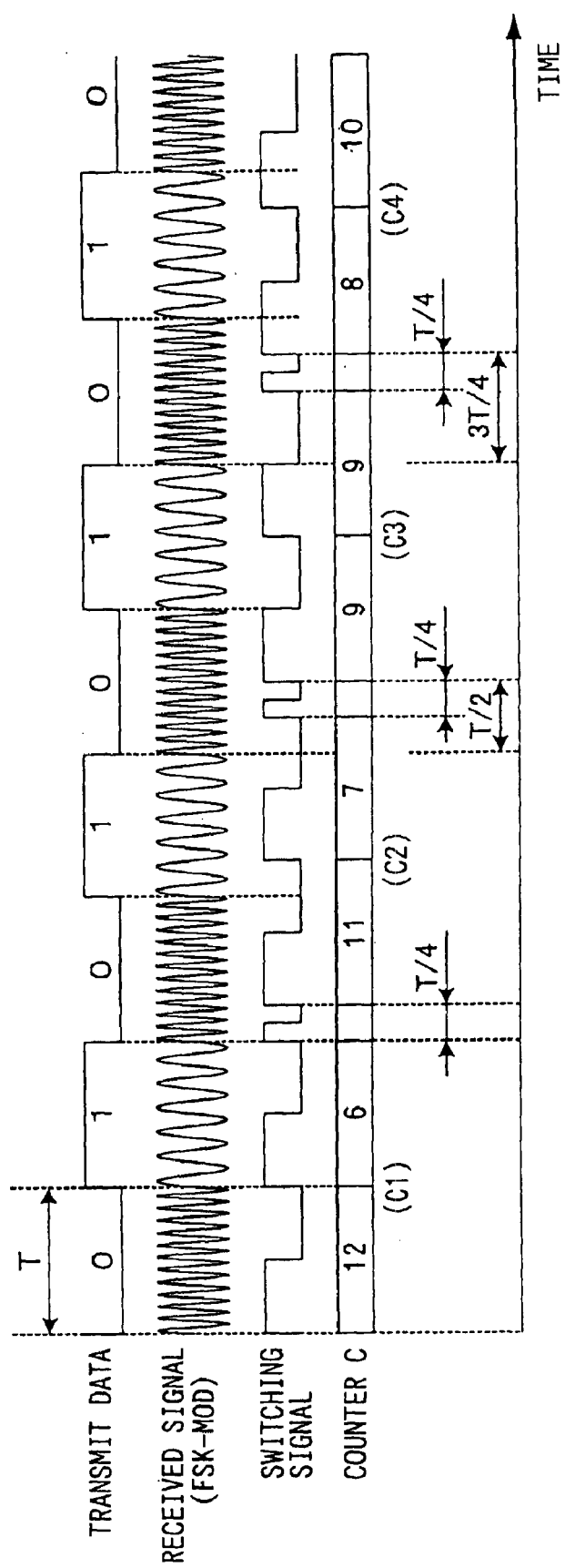
FIG. 9 is a timing chart of the demodulator of the fifth embodiment.

The timing generation circuit TMb has a synchronization judgment mode and demodulation mode, and causes the counter C to operate at different timings in the modes. As shown in FIG. 9, in the synchronization judgment mode, the timing generation circuit TMb operates the counter C so that the adjusting period is inserted once at every repetition of a preset number of times (twice in the case of FIG. 9) of count period.

Consequently, the demodulator 10b can get count values for the specified number of times of repetition for the individual counting periods that differ in timing by T/4 within the bit time width T. Namely, it can get the count values, which would be produced by the counters C1 to C4 of the first embodiment, from the single counter C.

The synchronization timing setting section 14b holds the count values produced by the counter C separately for the counting periods of different timings. Based on the held count values, it designates a timing that is virtually coincident with the bit border in the same manner as of the synchronization timing setting section 14 of the first embodiment, and indicates the timing to the timing generation circuit TMb.

The timing generation circuit TMb turns to the demodulation mode upon receiving the signal of timing, and generates such a timing signal that the counter C repeats the count operation at the indicated timing. The code judgment section 16 compares the count value, which is produced by the counter C operating in the demodulation mode, with the threshold value to judge the signal level, thereby demodulating the digital signal.

As explained above, the demodulator 10b, which differs from the counterpart of the first embodiment in the manner of collection of count values used for the synchronization judgment, can be arranged without using analog circuit, and thus it can attain the same effect as the demodulator 10 of the first embodiment.

Particularly, the demodulator 10b is designed to obtain count values of different timings by means of a single counter C, and accordingly it can simplify the count section 12b significantly as compared with the first embodiment, whereby further size reduction is made possible.

Figure 8B:
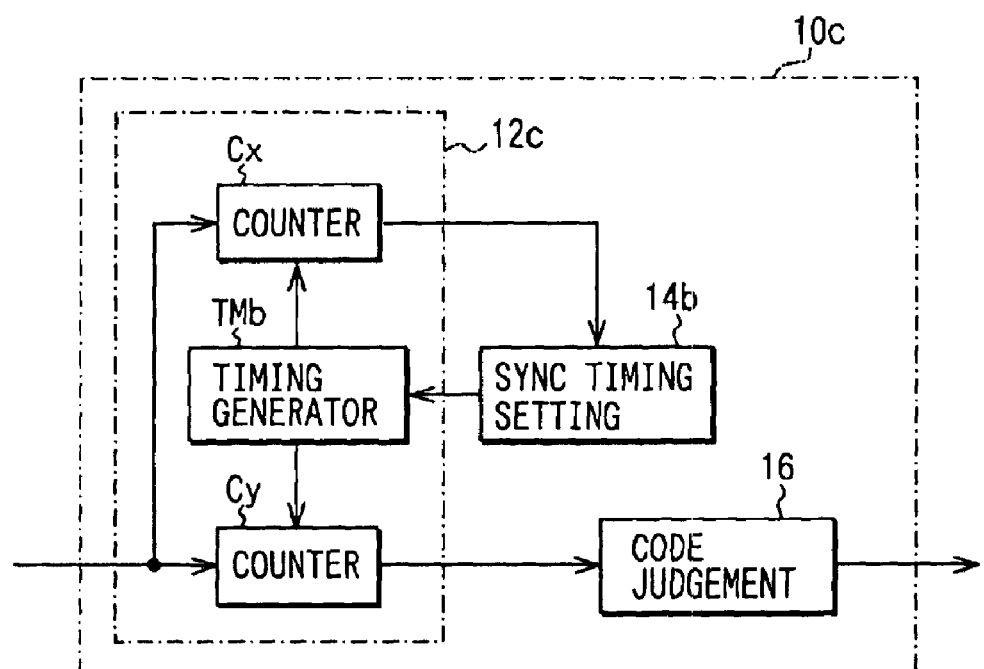
FIG. 8B is a block diagram showing a variant arrangement of a demodulator according to the fifth embodiment.

The demodulator 10b is designed to obtain the count value for demodulation by using the counter C that is used for synchronization judgment. Alternatively, as shown as demodulator 10c in FIG. 8B, a count section 12c may be arranged to include separately a counter Cx operating in the synchronization judgment mode and a counter Cy operating in the demodulation mode. In such a case, the demodulating operation and the synchronization judgment operation can take place concurrently, and the synchronized state can be retained even in the case of long-time communication.

[Sixth Embodiment]

Figure 10A:
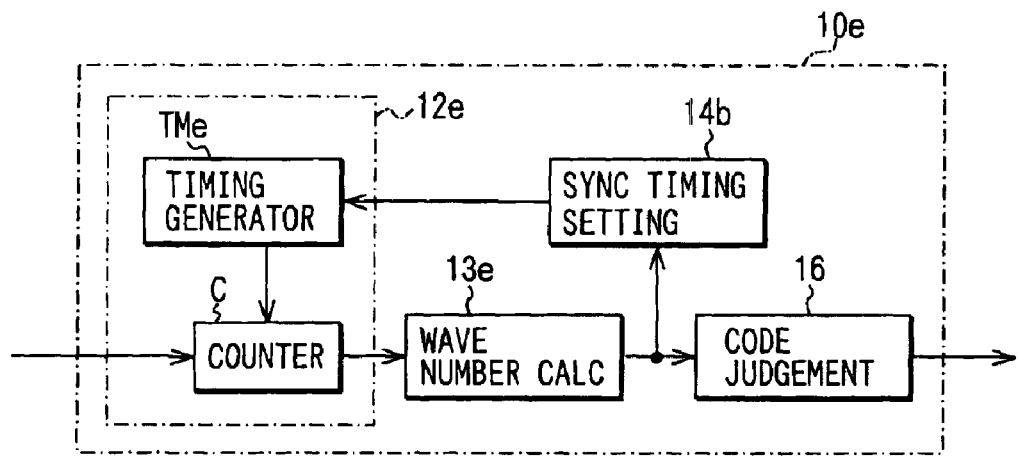
FIG. 10A is a block diagram showing an arrangement of a demodulator according to a sixth embodiment of the present invention.

As shown in FIG. 10A, a demodulator 10e includes a wave number calculation section 13e in addition to the arrangement of the fifth embodiment. The wave number calculation section 13e is connected between a count section 12e and the synchronization timing setting section 14b and code judgment section 16. The wave number calculation section 13e calculates the number of waves of the modulated signal based on the count value provided by the counter C that constitutes the count section 12e.

Figure 11:
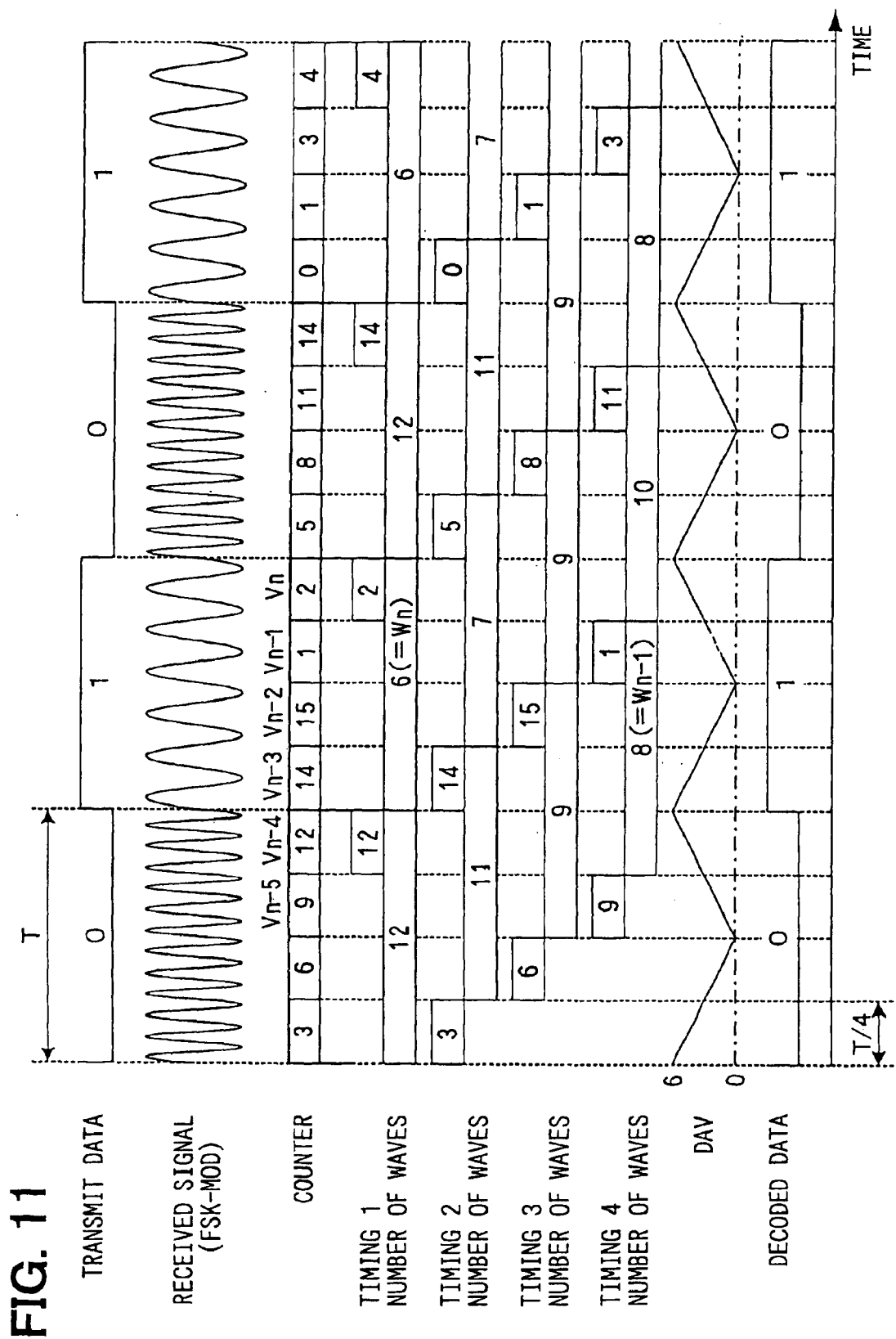
FIG. 11 is a timing chart of the demodulator of the sixth embodiment.

As shown in FIG. 11, the counter C of the demodulator 10e latches the count value at every quarter of the bit time width T in response to the timing signal produced by a timing generation circuit TMe. The counter C is a free-run counter that is not reset by the timing signal during the count operation.

Each time period cut out in every T/4 is called "divided period". Four consecutive divided periods form a counting period having the bit time width T. Accordingly, by combining divided periods, while shifting each divided period, four kinds of counting periods having different start timings within the bit time width T are formed.

The wave number calculation section 13e always memorizes count values Vn−4 to Vn−1 of the divided periods of at least one bit time width T (four periods of the past). The wave number calculation section 13 calculates the number of waves Wn of the modulated signal in the counting period, which is defined by the four divided periods, based on the count value Vn produced immediately by the counter C and the count value Vn−4 of the former divided period that precedes by the bit time width T (four periods).

The wave number calculation section 13 calculates the number of waves Wn by using the following equation (7) when the counter C does not overflow (Vn≧Vn−4) or by using the following equation (8) when the counter C overflows (Vn<Vn−4).

$$Wn = V_n - Vn_{n-4} \tag{7}$$

$$Wn = V_n - Vn_{n-4} + 2^k \tag{8}$$

The wave number calculation section 13 calculates the number of waves of the modulated signal for the four counting periods having different start timings within the bit time width T as shown in FIG. 11. The synchronization timing setting section 14b and code judgment section 16 operate in the same fashion as the fifth embodiment based on the calculated wave count.

The demodulator 10e operates in exactly the same fashion as the case of the fifth embodiment, except for the employment of a free-run counter for the counter C to obtain the number of waves in the counting periods based on the count value produced by the counter, and it attains the same effect as the fifth embodiment.

The count value of each divided period is obtained by use of the free-run counter that is not reset at each divided period. Consequently, errors included in individual divided periods are not cumulated in the number of waves of counting period that is calculated based on the count value of the divided period, whereby accurate demodulation can take place.

Figure 10B:
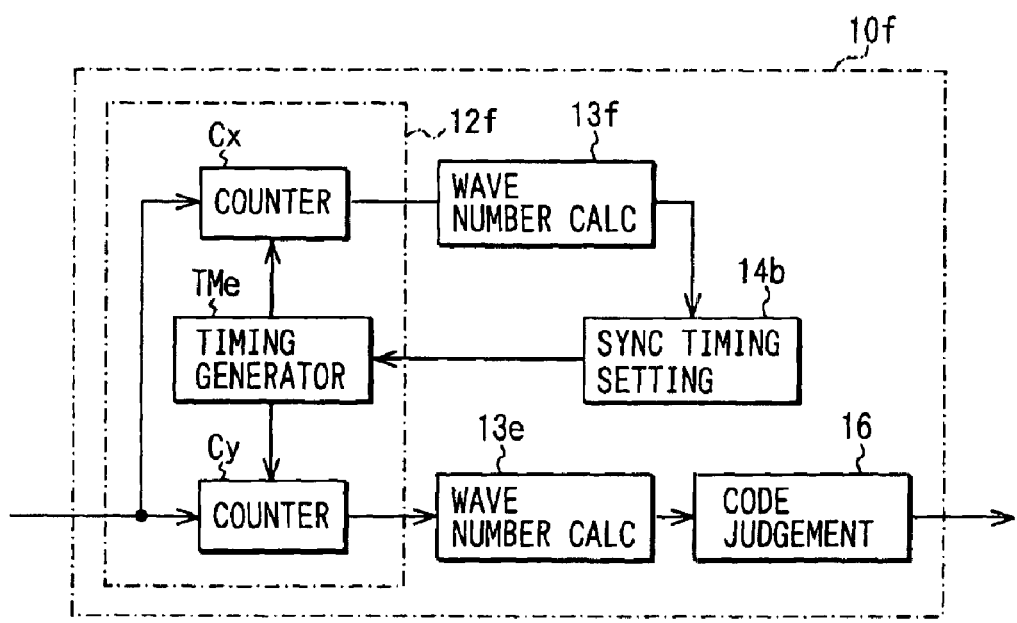
FIG. 10B is a block diagram showing a variant arrangement of a demodulator according to the sixth embodiment.

The demodulator 10e employs a free-run counter for the counter C that constitutes the demodulator 10b shown in FIG. 8A. As shown by a demodulator 10f in FIG. 10B, free-run counters may be used as the counters Cx and Cy that constitute the demodulator 10c shown in FIG. 8B. In this case, wave number calculation sections 13e and 13f are provided separately for the counters Cx and Cy.

[Seventh Embodiment]

Figure 12:
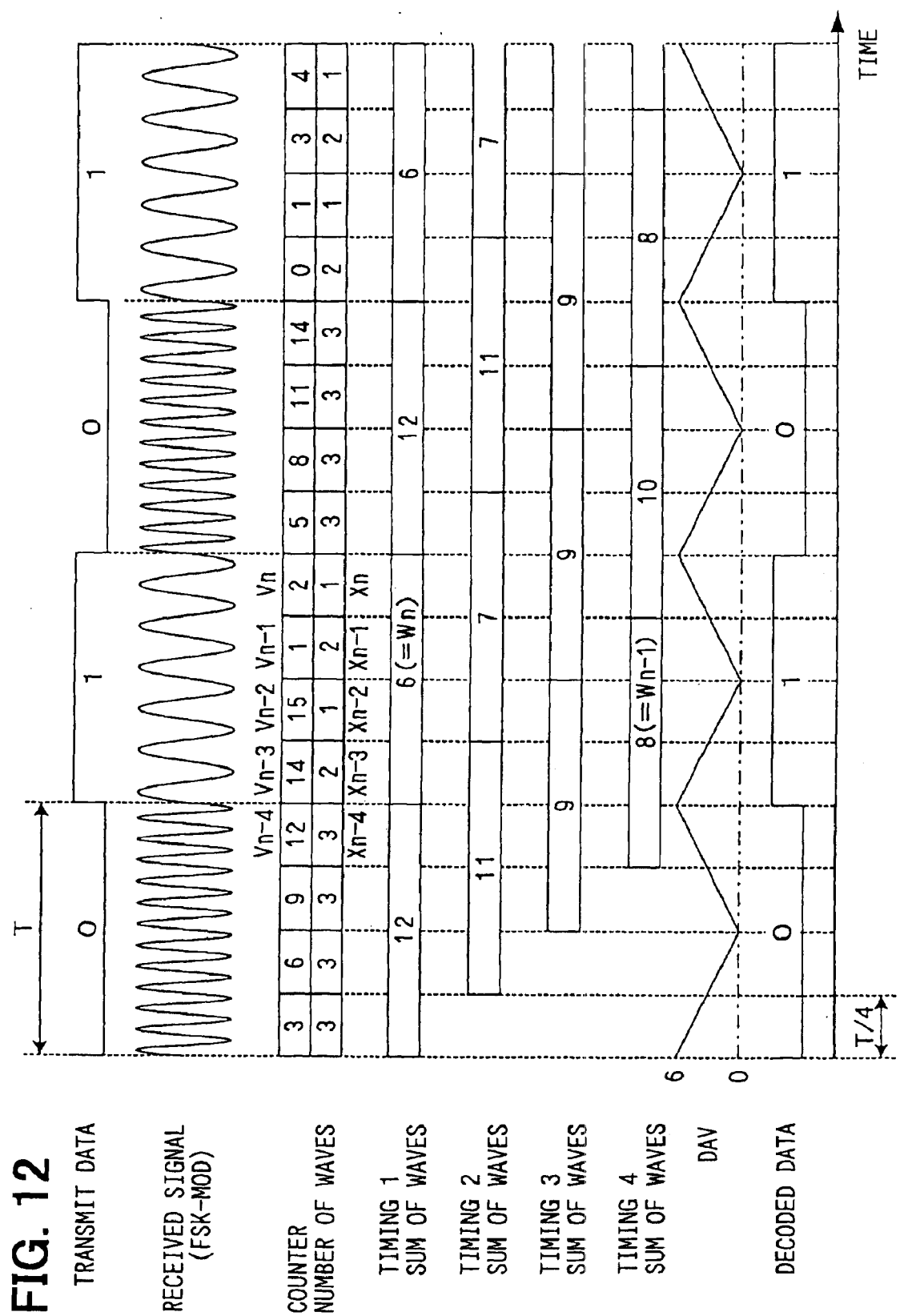
FIG. 12 is a timing chart of the demodulator according to a seventh embodiment of the present invention.

The seventh embodiment differs from the sixth embodiment in the operation of the wave number calculation sections 13. The wave number calculation sections 13 operates at each input of the count value Vn of a divided period produced by the counter C to calculate the number of waves Xn in the divided period based on the count value Vn and the count value Vn−1 of the immediately preceding divided period as shown in FIG. 12 (refer to the following equations (9) and (10)). It sums the count values Vn through Vn−3 of the divided periods of the past bit time width T (four past periods in this embodiment) thereby to evaluate the number of waves Wn of the counting period that corresponds to these divided periods (refer to the following equation (11)).

$$Xn = V_n - V_{n-1} \text{ (for } V_n \geq V_{n-1}) \tag{9}$$

$$Xn = V_n - Vn_{n-1} + 2^k \text{ (for } V_n < V_{n-1}) \tag{10}$$

$$Wn = X_n + X_{n-1} + X_{n-2} + X_{n-3} \tag{11}$$

In consequence, the wave number calculation section 13 evaluates the number of waves of the modulated signal in the four kinds of counting periods having different start timings within the bit time width T as shown in FIG. 12. The synchronization timing setting section 14b and code judgment section 16 operate based on the obtained number of waves in exactly the same fashion as the sixth embodiment.

The embodiment evaluates the number of waves Wn of each counting period based on the summation of the numbers of waves Xn obtained from the count value Vn of each divided period, instead of the subtraction of the count value Vn. Except for this operation, the embodiment operates in exactly the same fashion as the sixth embodiment, and it can attain the same effect as the sixth embodiment.

The present invention should not be limited to the embodiments previously discussed and shown in the figures, but may be implemented in various ways without departing from the spirit of the invention. For example, although the present invention is applied to the demodulator that demodulates an FSK-modulated signal by using a binary digital signal, it may be applied to a demodulator that demodulates a multi-value FSK-modulated signal.

Since the OOK (On-Off Keying) modulation, which is one type of amplitude modulation in which the amplitude is modulated to have 0% and 100% based on a binary digital signal, can be assumed to be an FSK modulation having one frequency and d.c. level, the present invention can also be applied to this modulation scheme.

What is claimed is:

1. A demodulation method for demodulating an FSK-modulated digital signal, the method comprising the steps of:

counting the number of waves of the FSK-modulated digital signal in every certain time period; and judging a digital signal based on the number of waves, wherein:

the certain time period is a bit-corresponding period corresponding to each bit of the FSK-modulated digital signal, the bit-corresponding period is a bit time width that is equal to a time length of one bit of the FSK-modulated digital signal, and the counting step has a plurality of start timings that are different from each other within the bit time width, and counts a plurality of the number of waves of the FSK-modulated digital signal in a plurality of the bit time widths that start in the plurality of start timings.

2. The demodulation method according to claim 1, further comprising the steps of:

designating one of the start timings based on the plurality of the numbers of waves as a synchronized timing corresponding to a bit border of the FSK-modulated digital signal; and defining a time period of the bit time width separated by the synchronized timing as the bit-corresponding period.

3. A demodulation method for demodulating an FSK-modulated digital signal, the method comprising the steps of:

counting the number of waves of the FSK-modulated digital signal in every certain time period; and judging a digital signal based on the number of waves, wherein the certain time period is a divided period that is shorter than the time length of one bit of the FSK-modulated digital signal.

4. A demodulator that demodulates an FSK-modulated digital signal, the demodulator comprising:

counting means for counting the number of waves of the FSK-modulated digital signal in every certain time period;

judgment means for judging a digital signal based on the number of waves; and designating means for designating a synchronized timing that corresponds to a bit border of the FSK-modulated digital signal, wherein:

the certain time period is a bit-corresponding period corresponding to each bit of the FSK-modulated digital signal, and the counting means defines a time period that is separated by the synchronized timing designated by the designating means as the bit-corresponding period.

5. The demodulator according to claim 4, wherein the designating means comprises:

wave number detection means for detecting the number of waves of the FSK-modulated digital signal in multiple kinds of counting periods that periodically repeat a bit time width, which is a time length of one bit of the FSK-modulated digital signal, and that have a plurality of start timings that are different from each other within the bit time width; and selection means for selecting a start timing of the counting period as the synchronized timing based on the number of waves so that the judgment means judges easily.

6. The demodulator according to claim 5, wherein the wave number detection means comprises:

a counter that counts a plurality of numbers of waves of the FSK-modulated digital signal within the counting periods; and timing switch control means that sequentially switches the start timings to one of the start timings for the counter.

7. The demodulator according to claim 6, further comprising timing setting means that sets the counter to operate at the synchronized timing selected by the selection means, wherein the counter that is set by the timing setting means is used as the counting means.

8. The demodulator according to claim 5, wherein the wave number detection means has a plurality of counters that operate at different start timings from each other, and that count the numbers of waves of the FSK-modulated digital signal in each counting period.

9. The demodulator according to claim 8, wherein the counting means uses the counter that operates at the synchronized timing selected by the selection means.

10. The demodulator according to claim 5, wherein the wave number detection means comprising:

a counter that counts the additional numbers of waves of the FSK-modulated digital signal in every divided period that is a division of the bit time width by a number of kinds of the start timings; and wave number calculation means that calculates the numbers of waves of the FSK-modulated digital signal in each counting periods having different start timings based on the additional number.

11. The demodulator according to claim 10, wherein the counting means uses one of the calculated number, which is provided by the wave number calculation means in correspondence with the synchronized timing selected by the selection means, as the number of waves.

12. The demodulator according to claim 6, wherein the counter is reset at every starting of the counting periods, and a count value of the counter at an end of the counting period is directly used as the number of waves of the FSK-modulated digital signal in the counting period.

13. The demodulator according to claim 6, wherein the counter is a free-run counter, and the number of waves of the FSK-modulated digital signal in the counting period is obtained from the count value of the free-run counter at the starting and ending of the counting period.

14. The demodulator according to claim 6, wherein the selection means calculates average values of the count numbers that are inferred to correspond to signal levels in every counting periods having different start timings, designates differences of the average values as judgment values, and selects a start timing of the counting period at which the judgment value is the largest.

15. The demodulator according to claim 14, wherein the selection means designates the judgment values by multiplying the number of data used for the calculation of the differences of the average values by the differences of the average values.

16. The demodulator according to claim 5, wherein the selection means calculates the number of times of occurrence of the count numbers that correspond to a middle level of the digital signal, and excludes the start timing from an object of selection when the number of times of occurrence exceeds a certain value.

17. A demodulator that demodulates an FSK-modulated digital signal, the demodulator comprising:

counting means for counting the number of waves of the FSK-modulated digital signal in every certain time period; and judgment means for judging a digital signal based on the number of waves, wherein:

the certain time period is a bit-corresponding period corresponding to each bit of the FSK-modulated digital signal, and a time difference of start timings of the counting period is set to be a time length shorter that a half of the bit-corresponding period.

18. A demodulator that demodulates an FSK-modulated digital signal, the demodulator comprising:

counting means for counting the number of waves of the FSK-modulated digital signal in every certain time period; and judgment means for judging a digital signal based on the number of waves, wherein the certain time period is a divided period that is shorter than a time length of one bit of the FSK-modulated digital signal, and the judgment means produces the digital signal based on the number of waves of every divided period.

19. A demodulator that demodulates an FSK-modulated digital signal, the demodulator comprising:

counting means for counting the number of waves of the FSK-modulated digital signal in every certain time period;

judgment means for judging a digital signal based on the number of waves; and a threshold value setting means that sets the threshold value based on the number provided by the counting means, wherein the FSK-modulated digital signal is a binary signal, and the judgment means produces the digital signal by comparing the number of waves corresponding to the center frequency of the FSK-modulated modulated signal.

20. The demodulator according to claim 19, wherein the threshold value setting means sets a middle value between a maximum value and a minimum value of the number provided by the counting means to the threshold value.

21. The demodulator according to claim 19, wherein the threshold value setting means sets an average of the number provided by the counting means to the threshold value.

22. The demodulator according to claim 19, wherein when two peaks exist in a distribution of the number provided by the counting means, the threshold value setting means sets a middle value of the two peaks to the threshold value.

23. A demodulator that demodulates an FSK-modulated digital signal, the demodulator comprising:

counting means for counting the number of waves of the FSK-modulated digital signal in every certain time period;

judgment means for judging a digital signal based on the number of waves; and a threshold value setting means that sets the threshold value based on the number provided by the counting means, wherein when two peaks exist in a distribution of the number provided by the counting means, the threshold value setting means sets a middle value of the two peaks to the threshold value.

24. A demodulator that demodulates an FSK-modulated digital signal, the demodulator comprising:

counting means for counting the number of waves of the FSK-modulated digital signal in every certain time period;

judgment means for judging a digital signal based on the number of waves;

radio wave environment inference means that infers a surrounding radio wave environment; and inhibiting means that inhibits an operation of the demodulator when the radio wave environment inference means judges that the radio wave environment is an inferior environment.

25. The demodulator according to claim 24, wherein the radio wave environment inference means judges that the radio wave environment is the inferior environment when a variation of the number provided by the counting means exceeds a certain upper-limit value.

* * * * *